United States Patent [19]

Ramachandran et al.

[11] Patent Number: 5,833,807
[45] Date of Patent: Nov. 10, 1998

[54] ARAMID DISPERSIONS AND ARAMID SHEETS OF INCREASED UNIFORMITY

[75] Inventors: Seshadri Ramachandran; Ronnie Aaron Allen, both of Chesterfield, Va.

[73] Assignee: E. I. du Pont de Nemours and Company, Wilmington, Del.

[21] Appl. No.: 843,876

[22] Filed: Apr. 17, 1997

[51] Int. Cl.$^6$ .................................................. D21H 13/26
[52] U.S. Cl. ....................... 162/157.3; 526/932; 528/489
[58] Field of Search ........................... 162/157.2, 157.3; 428/395, 359, 474.4; 525/182, 329, 338, 352; 528/253, 254, 489; 526/932

[56] References Cited

U.S. PATENT DOCUMENTS

| | | | |
|---|---|---|---|
| 3,384,535 | 5/1968 | Marek et al. | 162/157.3 |
| 3,880,710 | 4/1975 | Pattison | 162/167 |
| 4,529,481 | 7/1985 | Yoshida et al. | 162/157.3 |
| 5,240,561 | 8/1993 | Kaliski | 162/138 |

FOREIGN PATENT DOCUMENTS

| | | |
|---|---|---|
| 0178033 A2 | 4/1986 | European Pat. Off. |
| 3090693 | 4/1991 | Japan . |
| 3-217429 | 9/1991 | Japan . |
| 1141131 A | 2/1985 | U.S.S.R. . |

Primary Examiner—Stanley S. Silverman
Assistant Examiner—Dean T. Nguyen

[57] ABSTRACT

A process is disclosed for making aqueous aramid dispersion and aramid sheets of improved uniformity by utilizing water with a pH of greater than 10.

10 Claims, No Drawings

ARAMID DISPERSIONS AND ARAMID SHEETS OF INCREASED UNIFORMITY

BACKGROUND OF THE INVENTION

1. Field of the Invention

This invention relates to sheets and sheetmaking processes and, particularly to processes for making sheets with aramid fibers. Control of the pH of the fiber dispersions used in sheetmaking has been found to improve characteristics of the sheet product of the processes.

2. Description of the Prior Art

U.S. Pat. No. 5,240,561 issued Aug. 31, 1993 on the application of Kaliski teaches that paper can be made from natural or synthetic pulps in acid or alkaline furnishes using a microgel cement which is synthesized in situ during the paper making process.

U.S. Pat. No. 3,880,710 issued Apr. 29, 1975 on the application of Pattison teaches a wet strengthening resin for use in so-called alkaline papers which are made at pH's of above 5.5 and generally from 7.3 to 8.0.

European Patent Application No. 178,033 published Apr. 16, 1986 on the application of Garduno teaches preparation of a cellulosic paper using alkaline earth metal oxides and hydroxides and a pH of at least 7—with a maximum, in the examples, of 7.8.

USSR Certificate of Authorship published Feb. 23, 1985 discloses a process for production of paper using polyacrylamide and a cationic substance at pH of 7 to 9.5.

SUMMARY OF THE INVENTION

This invention relates to a process for making sheets with aramid fibers comprising the steps of: a) establishing a fiber dispersion under forces of agitation comprising aramid fibers and water wherein the aramid fibers are present at a concentration of 0.001 to 5 weight percent of the total dispersion and the water has a pH of greater than 10 to uniformly disperse the aramid fibers; and b) removing water from the dispersion through a porous support to form a wet-laid sheet with the aramid fibers.

The invention also relates to dispersions of aramid fibers in water having a pH of greater than 10 and to a process for making such dispersions.

DETAILED DESCRIPTION

Manufacture of aramid sheets exhibiting increased uniformity of thickness and uniformity of opacity has long been an object of workers in this field. It has been understood that aramid fibers, known generally as floc and pulp, which are used in the manufacture of aramid sheets, tend to agglomerate under traditional sheetmaking conditions, yielding blotchy sheets which are nonuniform as to opacity and thickness.

Aramid fibers in aqueous dispersion have a distinct tendency to form clumps. It has been discovered, however, that aramid fibers form uniform and relatively complete dispersions in water of pH greater than 10. The process of this invention is based on the fact that uniform sheets are made from uniform fiber dispersions and on the discovery that fiber dispersions of increased uniformity, for aramid fibers, can be made at a pH of greater than 10.

With regard to the aramid fibers used in the process of this invention, by "floc" is meant small fibers of aramid material having a length of 0.5 to 15 millimeters and a diameter of 4 to 50 micrometers, preferably a length of 1 to 12 millimeters and a diameter of 8 to 40 micrometers. It has been found that floc which is more than about 15 millimeters is more likely to entangle and form irreducible strings in the dispersion. Floc which is shorter than 0.5 millimeter is less effective and is difficult to produce. Floc is generally made by cutting filaments of aramid fiber, such as those prepared by processes described in U.S. Pat. Nos. 3,063,966; 3,133,138; 3,767,756; and 3,869,430.

By "pulp" is meant small fibers of aramid material having fibrils extending therefrom wherein the fiber diameter is generally 4 to 50 micrometers, the fibril diameter is only a fraction of a micrometer or a few micrometers, and the fibril length is 10 to 100. In sheet manufacture, the fibrils on pulp are important to act as hooks or fasteners to hold adjacent particles in the sheet and provide integrity to the sheet construction. The aramid pulp is made by refining floc or can be made directly from ingredients as was taught in U.S. Pat. Nos. 5,202,184 and 5,532,059.

Sheets can also be made using a combination of aramid fibers and fibrids wherein the fibrids serve as a binder to hold together the fibers and the other sheet components. Fibrids can be made from thermoplastic materials and from aramids. When fibrids are used, aramid fibrids are preferred for practice of this invention. Fibrids are not fibers. The term "aramid fibrids" refers to non-granular film-like particles of aromatic polyamide having a melting point or decomposition point above 320° C. The fibrids have an average length of 0.2 to 1 mm with a length-to-width aspect ratio of 5:1 to 10:1. The thickness dimension is on the order of a fraction of a micron. Fibrids are generally used in an undried form and can be deposited as a binder physically entwined about the aramid fiber component of a sheet. The fibrids in sheets of this invention can be prepared using a fibridating apparatus of the type disclosed in U.S. Pat. No. 3,018,091 where a polymer solution is precipitated and sheared in a single step.

Although the length of pulp particles is usually a direct consequence of the length of the starting floc, pulp generally has a length of about 0.15 to 10 millimeters. Surface area is an important characteristic of pulp to be used in this invention because the surface area is a measure of the degree of fibrillation and influences the porosity of the sheet and the effective area available for interfiber bonding. The surface area of pulp used herein is 0.5 to 20 square meters per gram, and the surface area for floc is 0.08 to 0.6 square meters per gram. Because floc lacks the fibrillation of pulp, sheets made with floc often, also, has a binder such as fibrids, among the sheet components.

By "aramid" is meant a polyamide wherein at least 85% of the amide (—CO—NH—) linkages are attached directly to two aromatic rings. Additives can be used with the aramid and it has been found that up to as much as 10 percent, by weight, of other polymeric material can be blended with the aramid or that copolymers can be used having as much as 10 percent of other diamine substituted for the diamine of the aramid or as much as 10 percent of other diacid chloride substituted for the diacid chloride of the aramid.

Para-aramids are the primary polymers in fibers of this invention and poly (p-phenylene terephthalamide)(PPD-T) is the preferred para-aramid. By PPD-T is meant the homopolymer resulting from mole-for-mole polymerization of p-phenylene diamine and terephthaloyl chloride and, also, copolymers resulting from incorporation of small amounts of other diamines with the p-phenylene diamine and of small amounts of other diacid chlorides with the terephthaloyl chloride. Copoly(p-phenylene/3,4'-diphenyl ether terephthalamide) is another para-aramid eligible for use in this invention.

Meta-aramids are, also, important for use in the fibers of this invention and poly(m-phenylene isophthalamide) (MPD-I) is the preferred meta-aramid. By MPD-I is meant the homopolymer resulting from mole-for-mole polymerization of m-phenylene diamine and isophthaloyl chloride and, also, copolymers resulting from incorporation of small amount of other diamines with the m-phenylene diamine and of small amounts of other diacid chlorides with the isophthaloyl chloride.

Fibrous sheets and fiber dispersions for making such sheets often include other components in addition to the fibers. Such components include additives such as colorants, fillers, binders, friction modifiers, and the like: Aramid fibers have been found to be difficult to disperse uniformly under the conditions usually used for sheet manufacturer. However, it has been discovered that, when aramid fibers are included as one of the components, a sheet of improved uniformity and opacity will result if the pH of the aramid fiber dispersion is adjusted to greater than 10 under forces of agitation at some time before forming the dispersion into a wet-laid sheet. Aramid fibers are substantially completely dispersed at the pH of greater than 10 and, once dispersed, it has been found that other components such as talc or diatomaceous earth or carbon black in the dispersion may assist in maintaining or stabilizing the dispersion. The dispersions and sheets of this invention can include from zero up to as much as 90 weight percent of additives or components other than aramid fibers, based on the total weight of the sheet, including aramid fibers and other components. Thus, in accordance with the present invention, the sheetmaking dispersion must be adjusted to have a pH of greater than 10 in the presence of the aramid fibers of the dispersion, even if the pH of the dispersion is later reduced to less than 10 before removing water from the dispersion.

Binder materials, if used in practicing the process of this invention, can be any material which assists, in the dried sheet product, to hold the fibers together. Eligible binder materials include the aforementioned aramid and thermoplastic fibrids and rubbers and elastomers in the form of latexes, and the like. Aramid fibrids are preferred binders for use with aramid floc; and latex binders are preferred for use with aramid pulp. Fibrid binders are generally used in concentrations of 5 to 95 and latex binders are generally used in concentration of 0.25 to 95 weight percent based on the weight of the sheet being made.

When a latex is used as binder material, flocculating agents such as aluminum sulfate, aluminum chlorohydrate, calcium chloride, mineral acids, and the like are added to the dispersion in such amount as to coagulate the latex binder. Aluminum sulfate is preferred.

The kernel of this invention resides in adjustment of the pH of the aramid fiber dispersion to greater than 10 to uniformly disperse the aramid fibers. For reasons not entirely understood, aramid fibers in water dispersion tend to agglomerate at pH's up to about 10 and tend to be repelled from each other and to become more completely and more uniformly dispersed at pH's of greater than 10.

As a practical matter, a pH range of 10.5 to 12 is preferred for practice of this invention. Dispersions with pH greater than 12 are hazardous and difficult to handle. The pH of these dispersions can be adjusted using any convenient base or alkaline material. Most usually used materials are sodium or ammonium hydroxide.

As a part of the process of this invention, an aqueous fiber dispersion is established comprising aramid fibers in water. The pH of that dispersion is adjusted to greater than 10 and water from that dispersion is removed such as by pouring the dispersion onto a porous support or screen to form a wet-laid sheet. The wet-laid sheet is dried; and that sheet is usually 5 to 95 percent aramid fibers, based on the total weight of the sheet. The aramid fibers include at least-one of aramid pulp and aramid floc. The dispersion is generally 0.001 to 5 weight percent aramid fibers, based on weight of the total dispersion. The concentration of fibers in the dispersion is selected to be convenient and to afford optimized dispersion and dispersion qualities.

Sheets made by the process of this invention find use as substrates for printed circuit boards, friction articles such as in clutch facing plates, thermal and electrical insulation, structural core and honeycomb material, and the like. The sheets can be pressed or calendered with heat and pressure to increase density and mechanical properties.

EXAMPLES

EXAMPLE 1

An aqueous dispersion of 0.3 weight percent poly(m-phenylene diamine terephthalate) (MPD-I) floc of 0.64 cm length (sold by E. I. du Pont de Nemours and Company under the trade name NOMEX®) having a pH of 7.44 was observed to have flocculated into "pillows" approximately 2.2 cm long and 0.64 cm at the widest cross-section. Sodium hydroxide was added to the dispersion under forces of agitation. The pH was initially raised to about 9.30; and the floc was partially dispersed. When the pH was raised to about 10.64, the flocculated pillows were uniformly dispersed to individual floc fibers and the fibers remained dispersed indefinitely, without any indication of reflocculation.

EXAMPLE 2

Five grams of para-aramid pulp were dispersed with a paddle stirrer in 750 gms of distilled water at 400 RPM for 30 minutes. The pulp was poly(p-phenylene terephthalamide) manufactured and sold by E. I. du Pont de Nemours and Company under the tradename of KEVLAR® and had a length of 0.8 mm and a surface area of 7.5 square meters per gram. The initial pH of the dispersion was measured to be 8.55. The dispersion appeared non-uniform with fiber clumps of approximately 5 to 10 mm in diameter. Sodium hydroxide was added with agitation to adjust the pH to 9.04. No change in the dispersion was observed. Further sodium hydroxide was added to change the pH to 9.28. The dispersion was slightly better; but with very little separation of individual pulp particles. When the pH was adjusted to 10.08, the dispersion looked much more uniform with individual pulp particles visible on the top. The pH was then increased to 10.43 and the dispersion became uniform with many individual pulp fibers and a floc size of less than 3 mm.

EXAMPLE 3

As a control, two grams of the same aramid pulp used in Example 2, above, were dispersed in 800 ml of distilled water in a 1000 ml beaker with a paddle stirrer located 6 cm from the bottom of the beaker, stirred for 5 minutes at 400 RPM followed by 60 minutes at 550 RPM. The pH was measured to be 7.75. A 170 mm diameter sheet was formed from this dispersion by filtering with a Buchner funnel under vacuum. The sheet was dried and observed by placing it on a light table. It was found to be non-uniform with many fiber clumps.

Two more grams of the same pulp were dispersed in 800 ml of distilled water in a 1000 ml beaker with a paddle stirrer located 6 cm from the bottom, stirred for 30 minutes at 550 RPM. The pH was measured to be 7.73. The pH of the dispersion was adjusted to 10.96 with sodium hydroxide. The dispersion was stirred at 550 RPM for an additional 30 minutes. A 170 mm diameter sheet was formed from this dispersion by filtering with a Buchner funnel under vacuum. The sheet was dried and observed by placing it on a light table. It was found to be more uniform than the sheet made at a pH of 7.75 and had fewer fiber clumps.

EXAMPLE 4

A paper sheet with 45 weight percent of the same pulp as was used in the previous examples, 53 weight percent diatomaceous earth filler (sold by Eagle-Picher Minerals under the tradename Celatom® MW12), 2 weight percent nitrile latex binder (sold by BF Goodrich Company under the tradename Hycar® 1562) (all dry basis percentages by weight) was prepared by mixing 4.42 gms (dry basis) of the pulp in approximately 1500 gms of water for 5 minutes in a disintegrator, known as a British Pulp Evaluation Apparatus available from Mavis Engineering, Ltd., London, England, followed by addition of 5.20 gms of the diatomaceous earth with mixing for another 5 minutes. The pH of the resulting dispersion was measured to be 7.30. The dispersion was mixed with a paddle stirrer at 500 RPM with addition of 0.48 gm of the latex which was 40.7 weight percent solids. The pH was measured to be 7.35. With the mixer running, 6.34 gms of 6 weight percent aqueous aluminum sulfate were added to the dispersion and mixed for one minute. The dispersion pH was measured to be 3.90. The dispersion was poured into an approximately 210 mm×210 mm handsheet mold containing 8000 gms of water. The slurry was stirred by hand and the pH was measured to be 4.70. The water was drained and a wet-laid sheet was formed. The sheet was placed between two pieces of blotting paper, hand couched with a rolling pin, and dried in a handsheet dryer at 190 C. The sheet was observed, on a light table, to be non-uniform with fiber clumps of 30 to 40 mm as large dark areas.

Another sheet with the same composition as above was made but with an adjustment of the pH, using sodium hydroxide solution, to higher levels as follows: the pH of the initial pulp dispersion was adjusted to 11.00; the pH after addition of the diatomaceous earth was 11.06; and the pH after addition of the latex was 11.04. With the mixer running, 7.15 gms of the 6 weight percent aluminum sulfate solution was added to the dispersion and mixed for one minute. The dispersion pH was then measured to be 4.3. The dispersion pH was then raised to 10.80 by addition of sodium hydroxide. The dispersion was poured into an approximately 210 mm 10×210 mm handsheet mold containing 8000 gms of water at high pH. The slurry was stirred by hand and the pH was measured to be 11.07. The water was drained and a wet-laid sheet was formed. The sheet was placed between two pieces of blotting paper, hand couched with a rolling pin, and dried in a handsheet dryer at 190 C. The sheet was observed on a light table to be more uniform than the sheet made at lower pH with most clumps less than 10 mm in size.

EXAMPLE 5

A paper sheet with 20 weight percent of the same pulp, 75 weight percent diatomaceous earth, 4 weight percent cotton linters, and 1 weight percent nitrile latex binder was prepared as follows: 1.46 gms of the pulp and 0.39 gms of the cotton linters were added to approximately 1500 gms of water and were mixed for 5 minutes in a disintegrator. The diatomaceous earth was added to the dispersion and mixed for another 5 minutes. The dispersion pH was measured to be 7.18. Agitation of the dispersion was continued with a paddle stirrer at 500 RPM. 0.10 gm of the latex was then added to the dispersion and mixed for one minute. The pH was measured to be 7.20. With the mixer running, 1.04 gms of 6 weight percent aluminum sulfate solution was added to the dispersion and mixed for one minute. The dispersion pH was then measured to be 5.54. Sodium hydroxide was added to adjust the pH to 7.21; and the slurry was stirred at 500 rpm for about 30 minutes.

The dispersion was poured into an approximately 210 mm×210 mm handsheet mold containing 8000 gms of water. The slurry was stirred by hand and the pH measured to be 6.92. The water was drained and a wet-laid sheet was formed. The sheet was placed between two pieces of blotting paper, hand couched with a rolling pin, and dried in a handsheet dryer at 190 C. The sheet was observed on a light table to be non-uniform with white areas containing a large amount of diatomaceous earth on the top side. Also, the sheet had 153 "neps" or areas of fiber clumps that showed up as dark spots when viewed on the light table.

Another paper sheet was made under similar conditions as above except that the pH was adjusted to 10.95 with sodium hydroxide after the aluminum sulfate addition and the dispersion was stirred for 30 minutes. The dispersion was then poured into the handsheet mold with 8000 gms of water at high pH and stirred by hand. The pH was measured to be 10.84. The water was drained and the sheet was formed, couched, and dried as above. The sheet was observed on a light table to be more uniform than the previous sheet and had only 67 "neps". The diatomaceous earth appeared to be much better distributed throughout the sheet. This example thus again illustrates the improved paper uniformity that is achieved through the use of a pH of greater than 10 in the fiber dispersion.

Another paper was made under similar conditions as above except that the pH was raised to greater than 10 prior to addition of aluminum sulfate and was not significantly adjusted after that. The paper was prepared as follows: pulp and cotton linters were added to approximately 1500 gms of water. Sodium Hydroxide was added to the dispersion of pulp and cotton linters to yield a pH of 11.03. The dispersion was mixed for 5 minutes in a disintigrator. The diatomaceous earth was added to the dispersion and mixed for another 5 minutes. The pH was measured to be 10.96. The latex was added to the dispersion and mixed for one minute. The pH was measured to be 10.93. With mixer running, 5.60 gms of 6 weight percent aqueous aluminum sulfate solution was added to the dispersion and mixed for one minute. The pH was measured to be 5.74. Sodium hydroxide was added to adjust the pH to 6.86; and the dispersion was poured into an approximately 210 mm×210 mm handsheet mold containing 8000 gms water. The dispersion was stirred by hand and the pH measured to be 6.97. The water was drained, hand couched with a rolling pin, and dried in a handsheet dryer at 190° C. The sheet was observed on a light table to be uniform with the diatomaceous earth uniformly distributed throughout the sheet. The sheet had only 39 "neps" or areas of fiber clumps.

EXAMPLE 6

Control process:

To a tank containing 62,160 liters of water, 65.3 kgms of 0.64 cm-long para-aramid floc and 5,900 liters of dispersion containing 0.487 weight percent of meta-aramid fibrids were added. The para-aramid floc was a poly(para-phenylene terephthalamide) fiber product sold by E. I. du Pont de Nemours and Company under the trade name KEVLAR® 29. The meta-aramid fibrids were made from poly(metaphenylene terephthalamide) as described in U.S. Pat. No. 3,756,908 and exhibited a Shopper Riefer freeness of 300 ml. The fibrids were used as a binder for the paper. The resulting dispersion had a pH of 7.2. It was mixed for approximately 15 minutes and was then pumped to a supply tank from which it was fed to an Inclined Wire type papermachine at a rate of 1135 liters per minute through a 41 cm Black Clawson Twin Hydra Disc refiner running with a motor load of 100 amps. The total flow to the headbox of the papermachine was 5,000 liters per minute. This paper was dried and wound in accordance with normal papermaking practices.

High pH process of this invention:

To a tank containing 62,610 liters of water, 65.3 kgms of 0.64 cm long para-aramid floc and 5,260 liters of dispersion containing 0.544 weight percent of meta-aramid binder fibrids were added. Sodium hydroxide was added to adjust the dispersion pH to 11.4. The dispersion was mixed for approximately 15 minutes and then pumped to a supply tank from which it was fed to an Inclined Wire type papermachine at a rate of 1135 liters per minute through a 41 cm Black Clawson Twin Hydra Disc refiner which was running with a motor load of 100 amps. The total flow to the headbox was 5,000 liters per minute. All other water supplies on the papermachine were adjusted to have a pH of 11.4. This paper was dried and wound in accordance with normal papermaking practices.

The paper resulting from the process of this invention was more uniform in appearance than paper from the control process.

What is claimed is:

1. A dispersion of aramid fibers in water wherein the aramid fibers are selected from the group consisting of aramid floc having a length of 0.5 to 15 millimeters and a diameter of 4 to 50 micrometers, aramid pulp having a length of 0.15 to 10 millimeters and a surface area of 0.5 to 20 square meters per gram, and a combination of such aramid floc and aramid pulp and wherein the water has a pH of greater than 10 and concentration of the aramid fibers in the water is 0.001 to 5 weight percent of the total dispersion.

2. A process for making a sheet from aramid fibers comprising the steps of:
  a) establishing a fiber dispersion under forces of agitation comprising aramid fibers and water wherein the aramid fibers are present at a concentration of 0.001 to 5 weight percent of the total dispersion and the water has a pH of greater than 10 to uniformly disperse the aramid fibers; and
  b) removing water from the dispersion through a porous support to form a wet-laid sheet with the aramid fibers.

3. The process of claim 2 wherein the aramid fibers include aramid floc.

4. The process of claim 2 wherein the aramid fibers include aramid pulp.

5. The process of claim 2 wherein the dispersion includes a binder.

6. The process of claim 5 wherein the binder is aramid fibrids.

7. The process of claim 5 wherein the binder is a latex.

8. The process of claim 2 wherein the dispersion of step a) also includes up to 90 weight percent of components other than aramid fibers, based on the total weight of the components and the aramid fibers, and the pH is reduced before step b).

9. A process for making an aqueous dispersion of aramid fibers comprising the steps of: adding aramid fibers to water, under forces of agitation; and adjusting the pH of the water with the added fibers to greater than 10 under continued forces of agitation.

10. A process for making an aqueous dispersion of aramid fibers comprising the steps of: adjusting the pH of water to greater than 10, under forces of agitation; and adding aramid fibers to the water under continued forces of agitation.

* * * * *